United States Patent
Tadeparthy

(10) Patent No.: US 7,126,523 B2
(45) Date of Patent: Oct. 24, 2006

(54) REDUCING ERRORS AND POWER CONSUMPTION IN A MULTI-STAGE ANALOG TO DIGITAL CONVERTER (ADC) USING AMPLIFIER SHARING TECHNIQUES

(75) Inventor: Preetam Charan Anand Tadeparthy, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/163,901

(22) Filed: Nov. 3, 2005

(65) Prior Publication Data

US 2006/0125675 A1    Jun. 15, 2006

Related U.S. Application Data

(60) Provisional application No. 60/635,648, filed on Dec. 13, 2004.

(51) Int. Cl.
*H03M 1/34* (2006.01)

(52) U.S. Cl. ........................ 341/162; 341/155

(58) Field of Classification Search ................ 341/155, 341/162, 161
See application file for complete search history.

(56) References Cited

U.S. PATENT DOCUMENTS

| | | | | |
|---|---|---|---|---|
| 5,917,440 A | * | 6/1999 | Khoury | 341/143 |
| 6,400,301 B1 | * | 6/2002 | Kulhalli et al. | 341/155 |
| 6,509,746 B1 | * | 1/2003 | Wang | 324/678 |
| 6,686,799 B1 | * | 2/2004 | Ivry | 327/560 |
| 6,870,495 B1 | * | 3/2005 | Zadeh et al. | 341/161 |
| 2002/0027453 A1 | * | 3/2002 | Kulhalli et al. | 327/96 |

* cited by examiner

*Primary Examiner*—Rexford Barnie
*Assistant Examiner*—Joseph Lauture
(74) *Attorney, Agent, or Firm*—William B Kempler; W. James Brady; Frederick J. Telecky, Jr.

(57) ABSTRACT

An amplifier sharing technique in an analog to digital converter (ADC) in which a cascaded combination of a pre-amplifier and main amplifier is used to provide the required amplification for a first stage, and only the main amplifier is used to provide the amplification for the second stage. Switches and capacitors are used in conjunction such that the sampling and feedback capacitors of the first stage are connected across the cascaded combination in a first phase, and sampling and feedback capacitors of the second stage are connected across the main amplifier in a second phase. By appropriate choice of parameter values for various components, the second poles due to the pre-amplifier may be located at the higher frequency ranges obtaining the required unity gain bandwidth (UGB) without Miller compensation and/or additional gain.

10 Claims, 6 Drawing Sheets

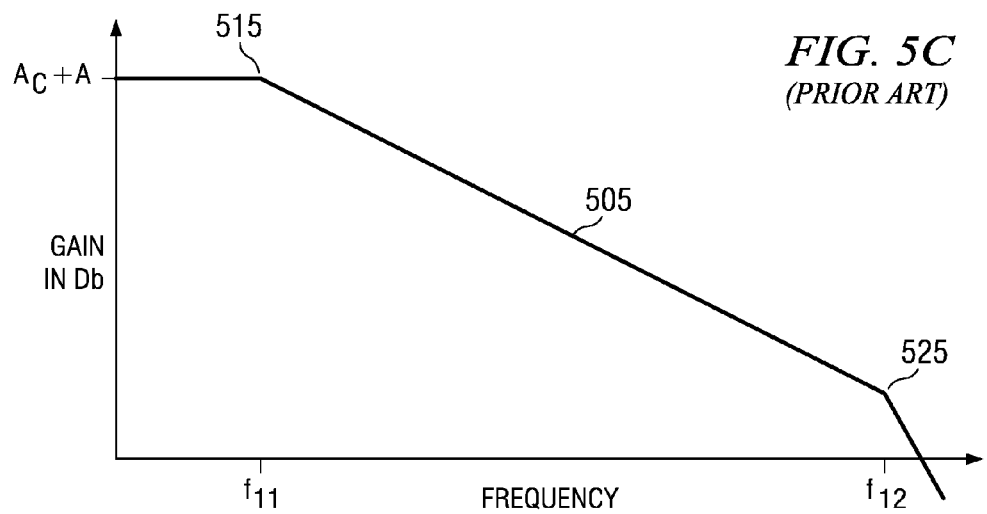
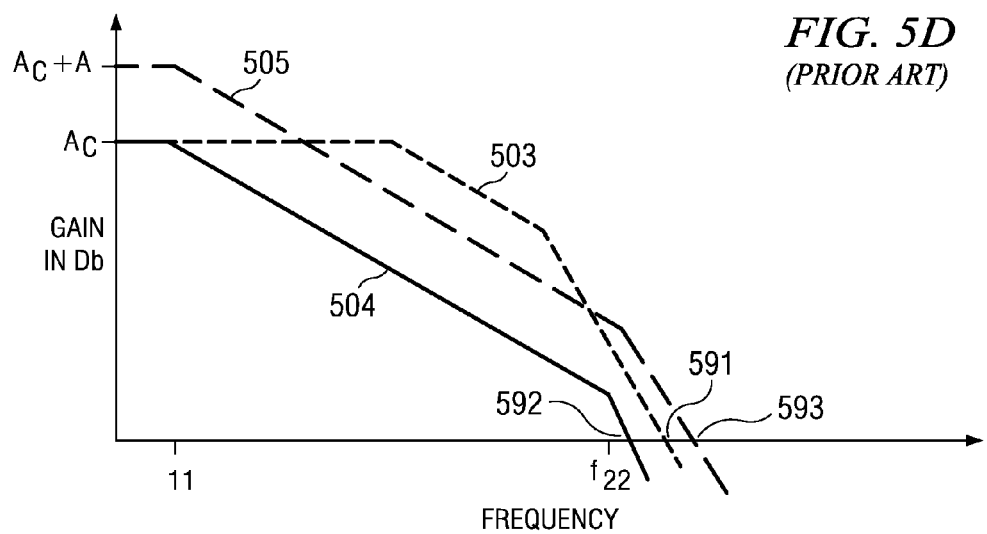
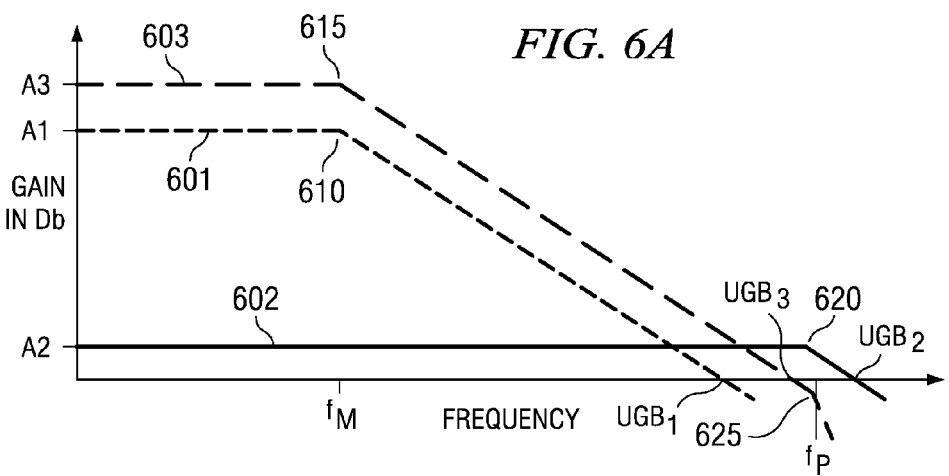

REDUCING ERRORS AND POWER CONSUMPTION IN A MULTI-STAGE ANALOG TO DIGITAL CONVERTER (ADC) USING AMPLIFIER SHARING TECHNIQUES

RELATED APPLICATION

The present application is related to the co-pending U.S. Provisional Patent Application Ser. 60/635,648, entitled, "Novel Amplifier Sharing Scheme for Pipeline Analog to Digital Converter", filed on 2004 Dec. 13, naming as inventor: TADEPARTHY et al and is incorporated in its entirety herewith.

BACKGROUND

1. Field of the Invention

The present invention relates generally to the design of analog to digital converters (ADC) and more specifically to method and apparatus providing efficient amplifier sharing in a multi_stage ADC.

2. Related Art

An analog to digital converter (ADC) is generally used to sample an analog signal at various time instances, and generate digital codes representing the strength of the sampled analog signal at the corresponding time instances. Typically, high resolution (representing each digital code in a large number of digital bits) ADCs are implemented using multiple stages. A pipelined ADC is a type of ADC which contains multiple stages, with each stage resolving a number of bits forming a sub-code. The sub-codes generated by various stages are used to generate a digital code corresponding to the sampled analog signal.

Each stage of an ADC generally needs an amplifier to amplify a residue signal representing a difference of the voltage level of the input signal and the voltage equivalent of the generated sub-code. For example assuming a stage generates a sub-code equaling S, the residue signal equals (Vin−(S*Vref/$2^p$)), wherein p represents the number of bits in the sub-code S, Vref represents a reference voltage and Vin represents sampled input signal.

The amplifier amplifies the residue signal generally with a gain of $2^p$ and provides the amplified residue signal as an input signal to the next stage. According to one prior approach, each stage is provided with a separate amplifier to provide the desired amplification for the stage. In the corresponding embodiments, the amplifier may not be utilized in some time durations (e.g., in sampling phase of the stage, as described with examples below), and the amplifier may continue to consume power in such un-utilized durations, as well. As a result, unacceptably large amount of power may be consumed by each of such stages.

In order to reduce the overall power consumption of the ADC, an amplifier is shared between two stages in a time multiplexed manner. For example, in one prior embodiment, an amplifier is used to amplify the residue signal of one stage in a first time duration and the same amplifier is used to amplify the residue signal of the other stage in a second time duration. Due to the reduction of the un-utilized time duration compared to the prior embodiment described in the above paragraph(s), the aggregate power consumption due to the two stages is reduced.

Even while using such techniques, there is a general need to minimize non-linearity and power consumption in analog to digital converters.

BRIEF DESCRIPTION OF THE DRAWINGS

The present invention will be described with reference to the following accompanying drawings.

FIGS. 5A–5D are Bode plots illustrating various disadvantages of a prior approach.

FIGS. 6A and 6B contain Bode plots depicting the gain versus frequency response of an embodiment of the present invention.

DETAILED DESCRIPTION

1. Overview

Two successive stages of an analog to digital converter (ADC) provided according to an aspect of the present invention contain a pre-amplifier and a main amplifier, impedances and switches, which together operate to amplify an input signal provided to a first stage using both the pre-amplifier and the main amplifier in a first phase, and to amplify an output of the first stage using only the main amplifier in the second stage in a second phase. The amplification of each of the first stage and the second stage is provided according to the following features:

1. The amplification characteristic in the first phase has a first pole and a second pole, and the amplification characteristic in the second phase has only a single pole;
2. The first pole of the first phase and the single pole of the second phase are at the same (or substantially same) location (frequency) for the same load. The pole locations may be determined from the output impedance of main amplifier and the capacitance load driven by the main amplifier in the respective phases.
3. The second pole of the first phase is controlled by the amplification characteristic of the pre-amplifier, and is selected such that the frequency response of the first phase has a unity gain bandwidth (UGB) not less than a desired frequency at which the stages are to operate.

The single pole and the transconductance (gm) of the main amplifiers may be chosen such that the bandwidth requirements of the second phase are met automatically and is not dependent on the first phase.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well known structures or operations are not shown in detail to avoid obscuring the features of the invention.

2. Example ADC

Figure 1:
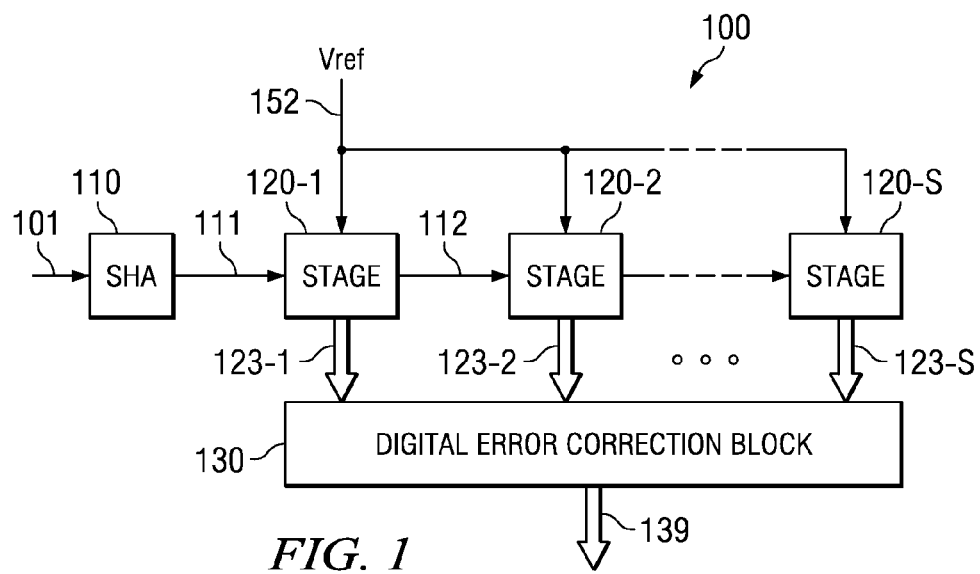
FIG. 1 is a block diagram of a pipe line ADC in which various aspects of present invention may be implemented.

FIG. 1 is a block diagram of a pipe line ADC in which various aspect of present invention may be implemented. ADC 100 is shown containing sample and hold amplifier (SHA) 110, stages 120-1 through 120-S and digital error correction block 130. Each block is described below in further detail.

SHA 110 samples the input analog signal received on path 101 and holds the voltage level of the sample on path 111 for further processing. Digital error correction block 130 receives sub-codes from various stages 120-1 through 120-S (on paths 123-1 through 123-S respectively), and generates a digital code corresponding to the sample received on path 101. Various error correction approaches, well known in the relevant arts, may be used to correct any errors in the received sub-codes. The generated digital code is provided on path 139 as a final digital code corresponding to the voltage of a sample on the input analog signal at a particular time instant.

Figure 2:
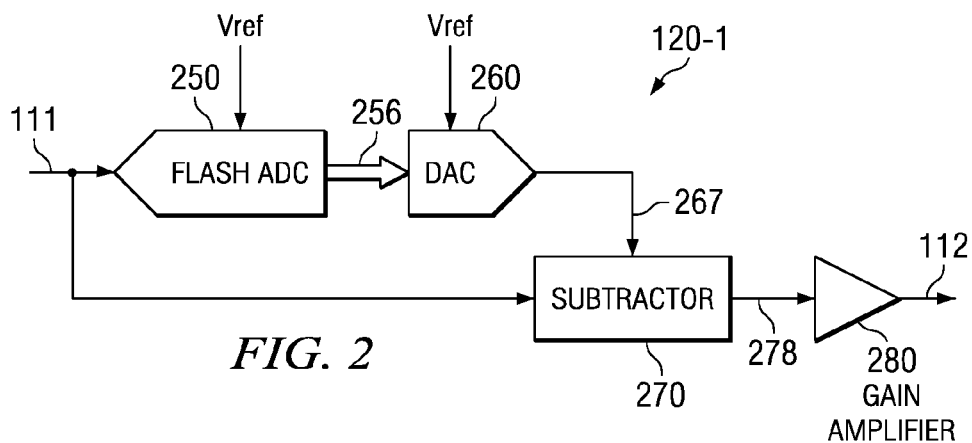
FIG. 2 is a block diagram illustrating the general operation of a stage of an ADC.

Each stage 120-1 through 120-S generates a sub-code (based on the reference signal Vref received on path 152) corresponding to a voltage level of an analog signal received as an input, and an amplified residue signal as an input to a (any) next stage. For example, stage 120-1 converts a voltage level on path 111 to generate a sub-code on path 123-1, and the amplified residue signal generated on path 112 is provided as an input to stage 120-2. A common reference signal Vref is generally provided to stages 120-1 through 120-S. FIG. 2 further illustrates (logical) components contained in each stage (described with reference to stage 120-1 only, for conciseness) of a pipe line ADC according to a known approach.

3. Stage of an ADC

With respect to FIG. 2, stage 120-1 is shown containing flash ADC 250, digital to analog converter (DAC) 260, subtractor 270 and gain amplifier 280. Flash ADC 250 (an example of a sub ADC) converts a sample of an analog signal received on path 111 into a corresponding p-bit sub-code provided on path 256 (contained in path 123-1 of FIG. 1, and P is less than N). DAC 260 generates the voltage equivalent of the sub-code received on path 256. The generated voltage (Vdac) is provided on path 267.

Subtractor 270 generates a residue signal as the difference of sample 111 (Vi) and the analog signal received on path 267. Gain amplifier 280 amplifies the residue signal (Vi–Vdac) and the amplified signal is provided on path 112 as an amplified residue signal. The signal on path 112 is used to resolve the remaining bits in the N-bit digital code by the subsequent stages of the ADC. The manner in which the residue signal is generated by each stage is described below with respect to FIGS. 3A and 3B.

Figure 3A:
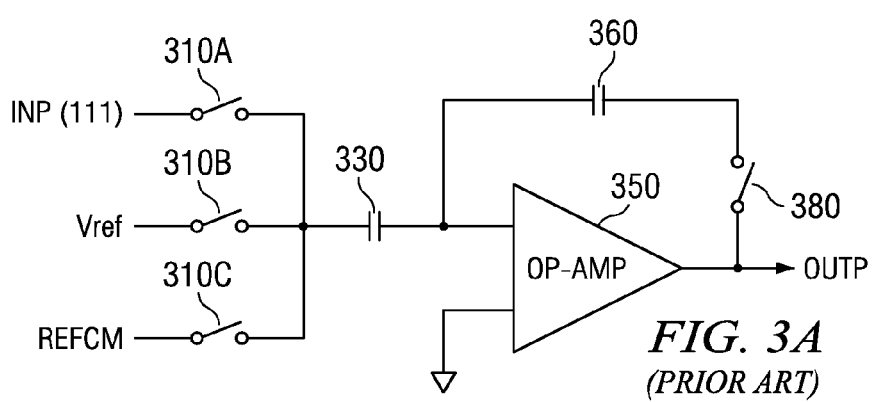
FIG. 3A is a circuit diagram illustrating the manner in which a DAC subtractor and gain amplifier ("residue amplification circuit") are implemented in a prior embodiment.
Figure 3B:
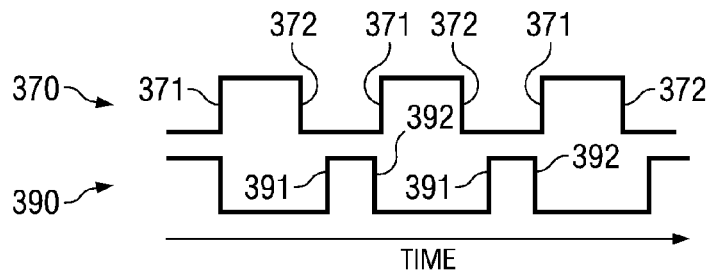
FIG. 3B is a timing diagram used to illustrate the sample and hold phases of residue amplification circuits.

FIG. 3A is a circuit diagram illustrating the manner in which DAC 260, subtractor 270, and gain amplifier 280 are implemented in an embodiment providing p-bit sub-codes and FIG. 3B is a timing diagram used to illustrate the sample and hold phases of the circuit. The circuit diagram is shown containing switches 310A–310C, sampling capacitor 330, op-amp 350, feedback capacitor 360, and feedback switch 380. Each component is described below in further details.

The circuit of FIG. 3A operates using two phase signals, shown as sampling phase 370 and hold phase 390 in FIG. 3B. In the first phase (sampling phase 370) between time points 371 and 372, switch 310A is closed at time points 371 and the remaining switches 380, 310B, and 310C are kept open. As a result, sampling (input) capacitor 330 is ideally charged (in duration between 371–372) to the voltage of input sample received on path (INP) 111.

In the second phase (between time points 391–392), feedback switch 380 is closed and switch 310A is kept open. Connections of switches 310B and 310C are made such that the input terminals of sampling capacitor 330 is connected either to Vref or to REFCM terminal, as determined from the output of flash ADC 250 (sub-code S). As a result, capacitor 330 transfers a charge proportional to the difference (residue) of input signal and the Vref or REFCM to feedback capacitor 360 (up to time point 392). The residue is amplified by op-amp 350 and provided as amplified residue signal to the next stage (on path OUTP), as desired.

It may be appreciated that op-amp 350 is used for amplifying the residue signal only between time points 391 and 392 (corresponding to hold/amplifying phase of stage 120-1). However op-amp 350 is not utilized (remain idle) between time points 371 and 372 (corresponding to the sampling phase of stage 120-1), which may lead to unacceptably high power consumption.

To reduce the power consumption, as an improvement, op-amp 350 is used to amplify the residue signal of stage 120-2 between time point 371 and 372 (in addition to amplifying the residue signal of stage 120-1 between time points 391 and 392). In such an approach, the input and output terminal of op-amp 350 are connected to the corresponding sampling and feedback capacitors of stage 120-2 between time point 371 and 372 by use of appropriate switches (not shown).

One disadvantage with such an operation is, a charge (voltage) present (due to parasitic capacitance) on the input terminal of op-amp at time point 392 may be carried to the amplification phase of stage 120-2, thereby causing a non-linearity (error) in the operation of stage 120-2 ("memory effect" well known in the relevant art).

The non-linearity due to the memory effect is proportionate to Vo/A1, wherein Vo represents the voltage on output terminal OUTP at time point 392, and A1 represents open loop gain of the amplifier. Similarly, when the use of op-amp 350 is shifted for use with stage 120-1, an undesired charge (voltage) present on the input terminal at time point 372 is presented from stage 120-2 to stage 120-1.

Various techniques are used to reduce the memory effect problem while sharing the amplifier between two stages. One known prior embodiment is described below in detail.

4. Another Prior Amplifier Sharing Circuit

Figure 4A:
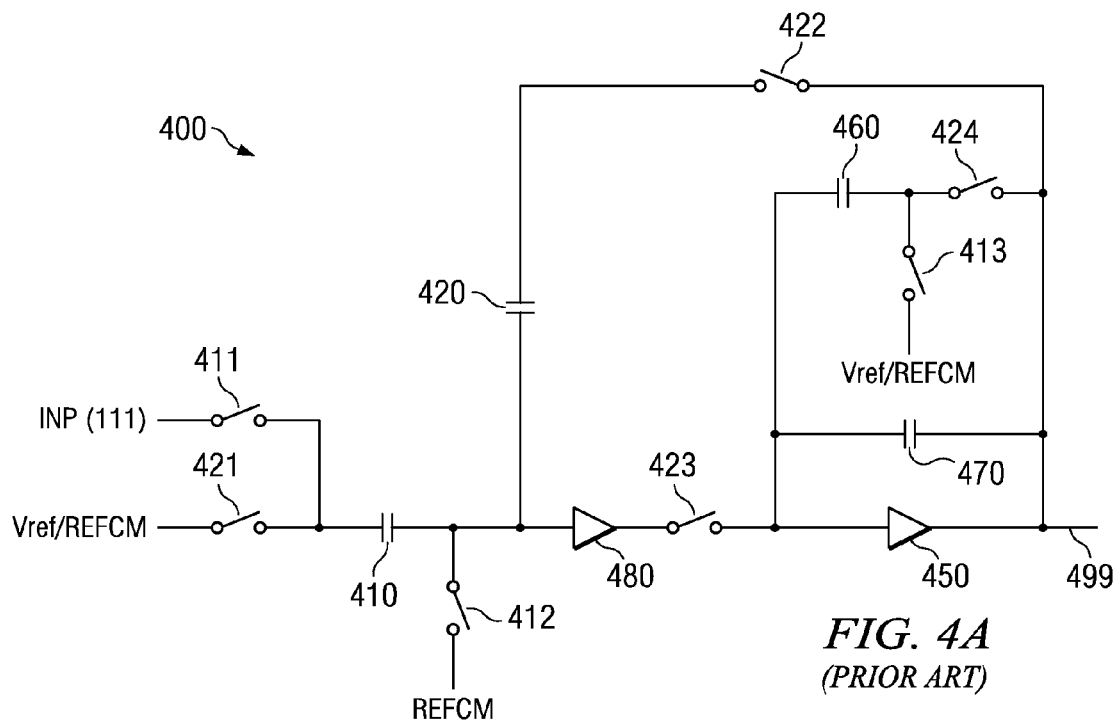
FIGS. 4A–4C together illustrate the operation of a residue amplification circuit in another prior embodiment.
Figure 4B:
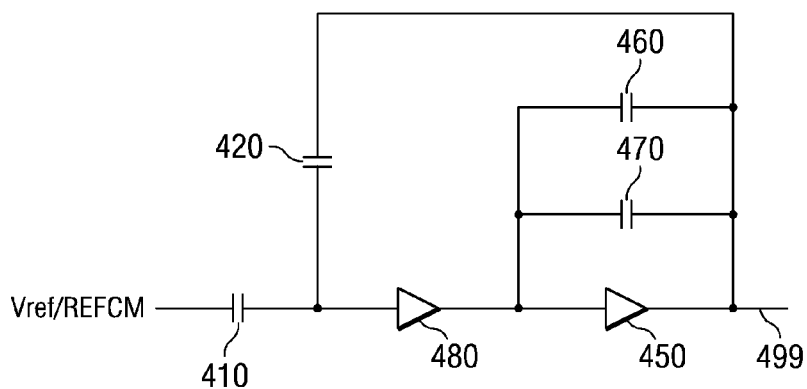
Figure 4C:
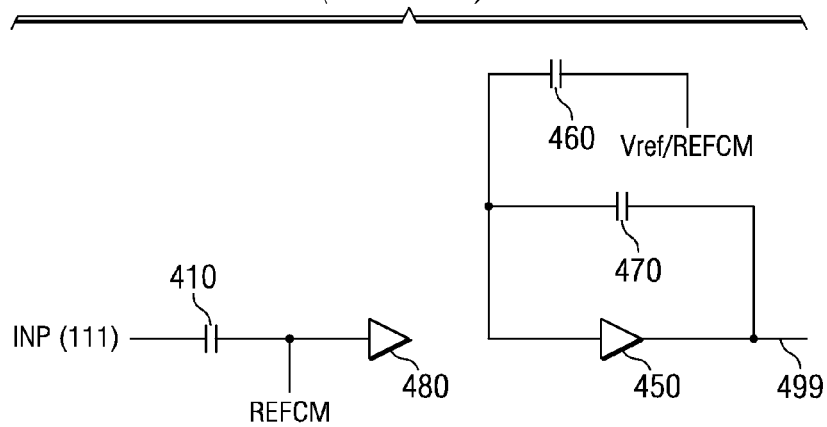

FIGS. 4A–4C together illustrate the operation of amplification circuit of FIG. 3A (with respect to FIG. 3B) in another prior embodiment. FIG. 4A is a circuit diagram representing implementation of amplifier sharing circuit in a prior embodiment described in U.S. Pat. No. 6,400,301 ("301 patent"). Only the pertinent details of the 301 patent are described in this application for conciseness. For further details, the reader is referred to the 301 patent.

The circuit diagram of FIG. 4A is shown containing pre-amplifier 480, main amplifier 450, capacitors 410, 420, 460 and 470, and switches 411–413 and 421–424. Pre-amplifier 480, main amplifier 450, capacitors 460 and 470 together operate as a Miller compensated amplifier, and amplifies residue signal of first stage (120-1). Main amplifier 450 along with capacitors 460 and 470 operates as second stage (120-2) amplifier.

Hence, main amplifier 450 is shared between stages 120-1 and 120-2, and the power consumption is reduced as a result. Further, due to the use of different input terminals for two stages, i.e., first stage residue signal is provided on input of pre-amplifier 480, and the residue signal of second stage is provided to input of main amplifier 450, the memory effect briefly noted above, is avoided. The operation of circuit 400 is described below with respect to FIGS. 4B and 3B in further detail.

FIG. 4B is a circuit diagram depicting the operation of circuit 400 in hold phase (between time point 391 and 392), in which switches 421–424 are closed and switches 411–413 are opened. For clarity and conciseness, the portions of the circuit not connected due to the open switches and not necessary for an understanding of the circuit operation, are not shown. Further capacitor 410 is assumed to be charged to a voltage proportionate to a input sample on path 111 during the previous phase of operation.

Switch 421 connects capacitor 410 to reference voltage Vref or common mode reference voltage REFCM based on the sub-code generated by stage 120-1. As a result, a charge proportionate to the difference of input and reference voltage (residue signal) is transferred to the capacitor 420. Pre-amplifier 480 and main amplifier 450 together amplify the residue signal and provide the amplified residue signal on path 499. Capacitors 460 and 470 operate as Miller compensation capacitors to provide stability to the amplifier formed by pre-amplifier 480 and main amplifier 450.

Assuming a high gain for main amplifier 450, the voltage across capacitors 460 and 470 also approximately equals the amplified voltage on path 499. Accordingly, the voltage across capacitor 460 represents a sampled value of the output of first stage 120-1 at time point 392.

FIG. 4C is a circuit diagram depicting the operation of circuit 400 in sample phase (between time point 371 and 372), in which switches 411–413 are closed and switches 421–424 are opened. Due to the opening of switch 423, main amplifier 450 and pre-amplifier 480 are separated. Sampling capacitor 410 is connected to the input path 111 and samples the input signal, thereby representing sampling phase of stage 120-1.

Closing of switch 413 connects capacitor 460 to a reference voltage Vref or a common mode reference voltage REFCM based on the sub-code generated by stage 120-2. As a result a charge proportionate to the difference of voltage stored between time point 291–292 and reference voltage (residue signal of second stage 120-2) is transferred to the capacitor 470. Main amplifier 450 amplifies the residue signal and provides amplified residue signal on path 499 representing an amplified residue signal of second stage 120-2.

Hence main amplifier 450 is used for amplifying first stage residue signal between time point 391–392 and used for amplifying second stage residue signal between time point 371–372. However, the undesired charge corresponding to second stage operation is present on the input terminals of main amplifier 450 and corresponding charge of first stage operation is present on the input terminals of pre-amplifier 480. As a result non-linearity due to the memory effect is avoided. However various disadvantages of the approach of FIGS. 4A–4C is illustrated with Bode plots below.

5. Disadvantages with Prior Amplifier Sharing Circuit

Figure 5A:
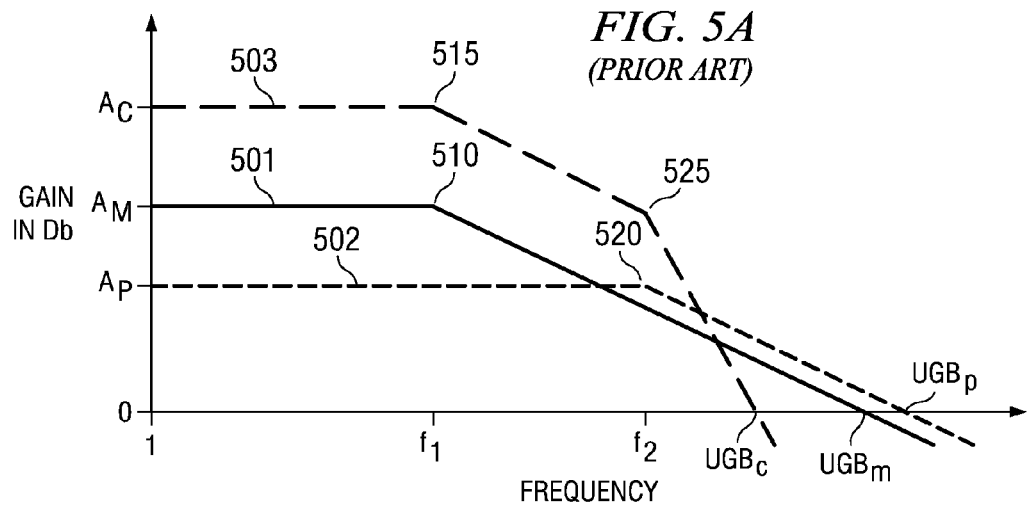

FIGS. 5A–5D are Bode plots illustrating various disadvantages of prior approach described above. FIG. 5A is shown containing curves 501, 502 and 503. Curve 501 represents frequency response of an amplifier implemented using only the main amplifier (450). Curve 502 represents frequency response of pre-amplifier (480) alone, and curve 503 represents the frequency response due to the cascaded connection of pre-amplifier 480 and main amplifier 450.

Curve 501 is shown with a DC gain of $A_M$ and a unity gain bandwidth of UGBm. Due to the impedances such as load due to second stage, parasitic capacitances, etc., a pole (510) is located at frequency $f_1$ resulting in decaying of gain with a slope of 20 Db/decade thereafter to touch 0 Db line at frequency UGBm.

Curve 502 is shown having a DC gain $A_p$, lesser than the gain $A_M$, and a unity gain bandwidth of UGBp which is greater than $UGB_m$ (Containing a pole 520 at frequency $f_2$ greater than $f_1$). Curve 503 is shown with a DC gain of $A_C$ and a unity gain bandwidth of $UGB_c$. The DC gain $A_C$ equals the sum of gains $A_M$ and $A_p$.

Curve 503 is shown with two poles 515 and 525 respectively at frequencies $f_1$ and $f_2$. Hence the gain response of the cascaded amplifier starts reducing with a slope of 20 Db/decade from frequency $f_1$ until frequency $f_2$. The gain starts reducing with slope 40 Db/decade after frequency $f_2$.

Due to the higher rate of decay, curve 503 reaches the 0 Db line at frequency ($UGB_C$) less than the UGBm, and $UGB_c$ represents the unity gain bandwidth ($UGB_c$ less than the $UGB_m$) of the cascaded connection. Further, two poles 515 and 525 being close to each other may cause instability to the cascaded amplifier.

Figure 5B:
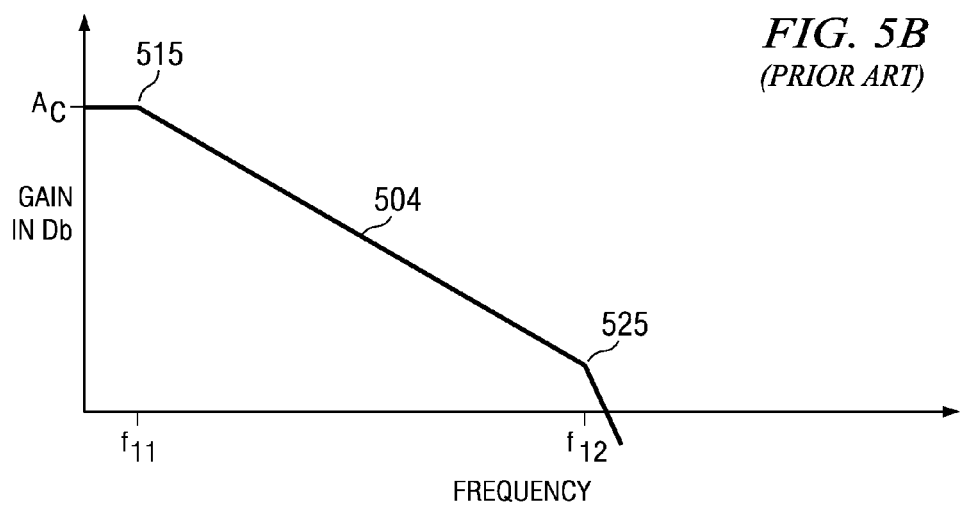

Miller compensation capacitor (460 and 470 described with respect to FIG. 4 above) is connected between the input and output of main amplifier (450) to provide stability. As a result, poles 515 and 525 are moved apart (as shown in FIG. 5B) from each other (even for the same load) and placed respectively at frequencies $f_{11}$ and $f_{12}$, wherein $f_{11}$ is less than $f_1$, and $f_{12}$ is greater than $f_2$.

Hence, the gain of cascade amplifier starts reducing with 20 Db/decade from much lower frequency ($f_{11}$), and 40 Db/decade roll-off (second pole) occurs at much higher frequency, providing a overall stability to the amplifier. However, the UGB is lower than the desired value because of additional loading due to 460 and 470.

In order to achieve required UGB of cascade amplifier, the overall DC gain of the amplifier is increased ($A_C$+A), as shown in FIG. 5C, and operated with much higher gain than the required gain, thereby consuming unneeded high power. Accordingly, the desired UGB of combined pre-amplifier and main amplifier is obtained by operating the respective operational amplifier at higher gain then the required gain (since the first pole is at the same frequency, the increase in UGB is due to the increase in the overall gain).

FIG. 5D illustrates Bode plot of cascaded amplifier without compensation (503), cascaded amplifier with compensation (504) and cascaded amplifier with increased gain to achieve a higher UGB (505) merely for comparison. Points 591–593 represent the UGB points in FIG. 5A–5C respectively. As may be seen, curve 505 consumes unneeded high power, as also noted above. Various aspects of the present invention overcome at least some of the disadvantages noted above.

6. Bode Plots of Example Embodiments

Figure 6B:
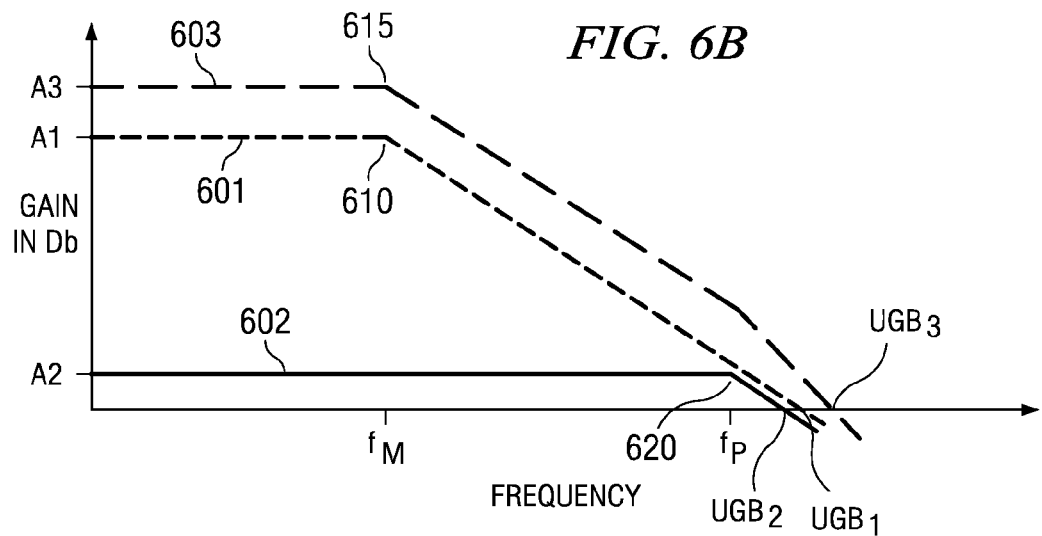

FIGS. 6A and 6B are Bode plots depicting the gain versus frequency (in logarithmic scale, as is usual in the relevant arts) response of an embodiment implemented according to various aspects of present invention. The Bode plots are shown containing curves 601, 602 and 603, respectively representing the frequency response of the main amplifier, pre-amplifier and combined pre-amplifier and main amplifier (in a cascaded connection). Each curve is described below in further detail.

Curve 601 represents a frequency response of a main amplifier shared between two stages (120-1 and 120-2). Curve 601 is shown with a DC gain of $A_1$ and a unity gain bandwidth of $UGB_1$. A pole 610 is located at frequency $f_M$, based on load offered by the components of second stage (120-2) such as sampling capacitors, parasitic capacitors etc.

$UGB_1$ represents a desired unity gain bandwidth for stage 120-2, which is lower than stage 120-1 (as some bits have already been resolved in first stage 120-1). The DC gain A1 represents a desired gain requirement of first stage 120-1. As a result, frequency response of main amplifier (curve 601) may be selected to meet a reduced UGB requirement for second stage 120-2 and the gain requirement of first stage 120-1. Since the gain requirement of the second stage is less than the gain requirement of first stage, frequency response of main amplifier (curve 601) independently meets the requirement of the second stage.

Curve 602 represents a frequency response of a pre-amplifier, and is shown with a gain $A_2$ and a unity gain bandwidth of $UGB_2$. A pole 620 is shown located at frequency $f_p$ based on the output impedance and capacitive load offered by the combination of the main amplifier and parasitic capacitors, etc. Since the DC gain requirement of first stage 120-1 is obtained (substantially obtained) from the DC gain A1 of main amplifier, the gain A2 may be selected to meet UGB requirements of first stage 120-1. Hence, the higher UGB requirement of a first stage may be achieved by cascading main amplifier with the pre-amplifier.

Curve 603 represents a frequency response of cascade connection of pre-amplifier followed by main amplifier used in the first stage 120-1 (according to present invention) between time points 391–392. The curve 603 is shown with a gain of $A_3$ and a unity gain bandwidth of $UGB_3$. Poles 615 and 625 correspond to poles 610 and 620 of curve 601 and 602 respectively.

Due to the frequency response of curve 602, the cascaded gain $A_3$ equals sum of gain $A_1$ and $A_2$. Gain $A_3$ remains a constant up to the location of first pole 615 ($f_M$), and then decays thereafter with 20 Db/decade. Since the second pole 625 is located after $UGB_1$, the gain of cascaded amplifier touches 0 Db line (unity gain bandwidth) after $UGB_1$. As a result, the desired higher UGB and gain is obtained from cascaded amplifier with pre-amplifier having frequency 602.

Further, as illustrated with reference to FIG. 6B, location ($f_p$) of pole 620 may be selected at a lower frequency (example, less than $UGB_1$ or near frequency ranges of $UGB_1$) while ensuring that the unity gain bandwidth of cascade connection of pre-amplifier and main amplifier meets the desired unity gain bandwidth ($UGB_1$) requirement of stage 120-1. It may be noted that the location of both poles 610 and 615 is at the same frequency ($f_M$) assuming the same load is offered to both the stages. The corresponding implementation may not enter unstable region since pole 625 is located away from the first pole 615 (corresponding to pole 610) to ensure desired stability.

Due to such an approach, the cascade amplifier may be readily used to provide the desired amplification for the first stage and the main amplifier may be used to provide the amplification for the second stage without compensation capacitors. Savings in area and power consumption may be realized due to the absence of the compensation capacitors (in comparison to the embodiments of FIG. 4A). An example amplifier implemented consistent with the Bode plots of FIGS. 6A and 6B is described below.

7. Amplifier Sharing Circuit

Figure 7A:
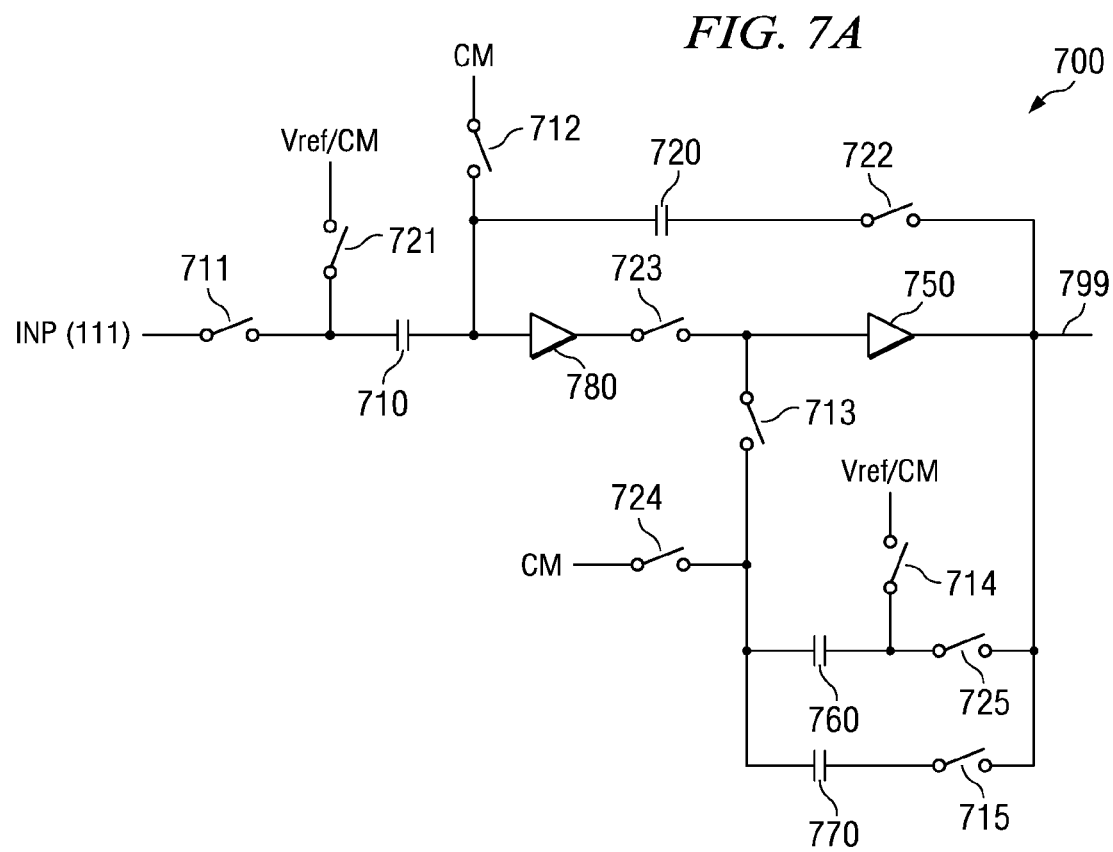
FIG. 7A is a circuit diagram illustrating the details of a circuit implemented according to an aspect of the present invention.

FIG. 7A is a circuit diagram of an amplifier sharing circuit in an embodiment of the present invention. The circuit diagram is shown containing main amplifier 750, pre-amplifier 780, capacitors 710, 720, 760 and 770, and switches 711–715 and 721–725. Each component is described below in further detail with respect to the timing diagram of FIG. 3B for illustration.

Broadly, main amplifier 750, capacitors 760 and 770 together operate to amplify the residue signal of stage 120-2 between time points 371–372 (as described below with reference to FIG. 7C). Main amplifier 750, pre-amplifier 780, capacitors 710 and 720 together operate to amplify the residue signal of stage 120-1 between time point 391–392 (as described below with reference to FIG. 7B).

Figure 7B:
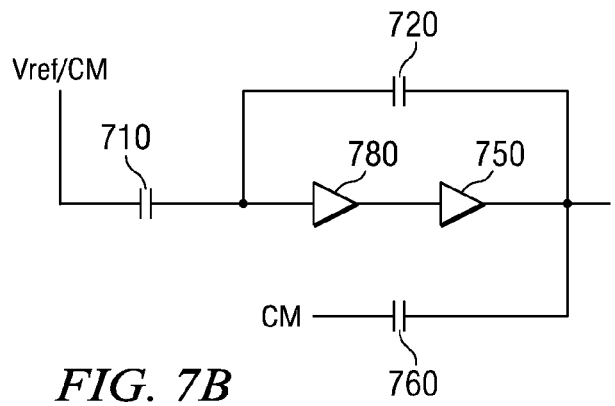
FIG. 7B is a circuit diagram depicting the operation of the circuit of FIG. 7A in a hold phase

FIG. 7B is a circuit diagram depicting the operation of amplifier sharing circuit 700 in hold phase (between time point 391 and 392), in which switches 721–725 are closed and switches 711–715 are opened. For clarity and conciseness, the portions of the circuit not connected due to the open switches and not necessary for an understanding of the circuit operation, are not shown. Further, capacitor 710 is assumed to be charged to a voltage proportionate to an input sample on path 111 during the previous phase of operation (as described below with reference to FIG. 7C).

Switch 721 connects capacitor 710 to reference voltage Vref or common mode reference voltage CM based on the sub-code generated by stage 120-1. As a result, a charge proportionate to the difference of input and reference voltage (residue signal) is transferred to the capacitor 720. Pre-amplifier 780 and main amplifier 750 together amplify the residue signal and provide the amplified residue signal on path 799.

It may be appreciated that pre-amplifier 780 drives only the main amplifier 750 (between time points 391 and 392), as against pre-amplifier 480 driving main amplifier and miller compensation capacitors 460 and 470 in the prior circuit of FIGS. 4A–4C). Hence, the UGB of pre-amplifier 780 can be selected to support the UGB requirement of first stage (as illustrated above with reference to FIGS. 6A and 6B) independent of second stage requirements. Also, excessive power needed to drive capacitors 460 and 470 is avoided.

Switch 725 connects one end of the capacitor 760 to path 799 (OUTPUT) and switch 724 connects another end of capacitor 760 to common mode CM. As a result, capacitor 760 samples the voltage on path 799 between time point 391 and 392. Thus the sampled voltage represents the output of first stage 120-1 at time point 392. Hence duration between time points 391 and 392 also represents the sampling phase of second stage 120-2. Amplification operation (hold phase) of second stage 120-2 is described below with respect to FIG. 7C.

Figure 7C:
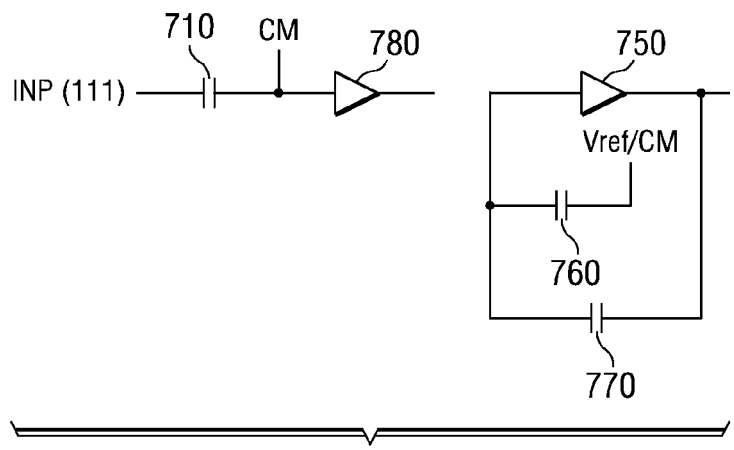
FIG. 7C is a circuit diagram depicting the operation of the circuit of FIG. 7A in a sampling phase

FIG. 7C is a circuit diagram depicting the operation of circuit 700 in hold phase of second stage 120-2 (between time point 371 and 372), in which switches 711–715 are closed and switches 721–725 are opened. Due to the opening of switch 723, main amplifier 750 and pre-amplifier 780 are separated. Sampling capacitor 710 is connected between input path 111 and common mode reference CM by switches 711 and 712. Hence capacitor 710 samples the input signal, thereby representing sampling phase of stage 120-1.

Closing of switch 714 connects capacitor 760 to a reference voltage Vref or a common mode reference voltage CM based on the sub-code generated by stage 120-2. Switch 713 and 715 connects capacitor 770 across main amplifier 750. As a result, a charge proportionate to the difference of voltage stored between time point 391–392 and reference voltage (residue signal of second stage 120-2) is transferred to the capacitor 770. Main amplifier 750 amplifies the residue signal and provides the amplified residue signal of second stage 120-2 on path 799 at time point 372.

In another embodiment, capacitor 770 may be used as sampling capacitor by closing switch 715 between time point 391 and 392 and used as feedback capacitor in the hold phase as described above between time point 371 and 372, there by representing a flip-around operation.

Hence main amplifier 750 is used for amplifying first stage residue signal between time point 391–392 and used for amplifying second stage residue signal between time point 371–372.3. Since pre-amplifier 780 drives only the main amplifier 750 between time point 391–392, effective capacitive impedance offered to the pre-amplifier 780 comes substantially from the main amplifier (load to the main amplifier is substantially due to second stage) as described below.

Since the open loop gain of pre-amplifier 780 can be selected independent of the gain of main amplifier 750, a non-dominant second pole may be located at higher frequency ranges as shown in FIGS. 6A and 6B by selecting an appropriate gain of pre-amplifier. As a result, stability is provided to amplifier sharing circuit 700 without Miller compensation capacitor such as 460 and 470. Further, the dominant pole 615 of cascaded amplifier remains at relatively same pole location of pole 610 of main amplifier, as against the respective pole locations of 515 and 510 of prior embodiment (due to Miller compensation).

It should be appreciated that the features above are described with reference to only dominant poles (which contribute to desired performance of the ADC) merely for illustration. Additional poles (typically insignificant poles) can also be included in alternative embodiments, without departing from the scope and spirit of several aspects of the present invention. The manner in which the UGB of pre-amplifier and the open loop gain of main amplifier may be selected independently is described below in further detail.

8. Selection of Open Loop Gain

The manner in which GBW (gain bandwidth) of pre amplifier and main amplifiers are independently selected to provide optimum power efficiency is described below. The bandwidth specifications are determined by the settling requirement of the amplifier. The settling requirement in turn is derived from allowable error or non-linearity. For purpose of illustration, it is assumed that an error limit is $Vref/2^{-N+3}$ (error limit 8 times lower than the LSB), wherein Vref represents the reference voltage, and N represents the number of bits to be resolved by the following stages.

The gain bandwidth ($\omega$) at the gain of interest (closed loop gain of 3 db) is given by:

$$\omega CL3 \ db = T/N + 3*Ln(2) \qquad \text{Equation (1)}$$

wherein T represents the time that the amplifier gets to settle (hold time 390 or sample time 370 in FIG. 3B). Hence in first phase, the amplifier bandwidth at the gain of interest may be written as $$\omega_{CL3 \ db} = G_{pre\text{-}amp} * G_m / C_L \qquad \text{Equation (2)}$$

wherein $G_{pre\text{-}amp}$ represents open loop gain of the pre-amplifier, Gm represents the trans conductance of the main amplifier, and Cl represents the capacitive load offered at the output of main amplifier.

Similarly, in second phase, the settling time and hence bandwidth requirement is given by:

$$\omega_{CL3B1} = T/N - K + 3*Ln(2) \qquad \text{Equation (3)}$$

wherein K represents the number of bits resolved by stage 120-2.

The amplifier bandwidth is given by:

$$\omega_{CL3 \ dB1} = G_M / C \qquad \text{Equation (3A)}$$

$$C = C_1 / P \qquad \text{Equation (4)}$$

wherein P is the scaling factor.

Because of the capacitive scaling (due to which later stages have lower capacitance values for sampling capacitors as the noise contribution reduces as more bits are resolved):

From equations 3A and 4

$$\omega_{CL3 \ dB1} = G_M / C_1 / P \qquad \text{Equation (5)}$$

From the above five equations, the open loop gain ($G_{pre\text{-}amp}$) of the pre-amp may be selected as $$G_{pre\text{-}amp} = P/1 - K/N + 3 \qquad \text{Equation (6)}$$

Hence selecting the pre-amp gain optimizes the stage to give best suited GBW. Since, the main amplifier GBW can be governed by equations 3–5, the GBWs of main amplifier and pre-amplifier can be independently set and optimized. The approaches thus described above, can be used in various devices. The description is continued with respect to an example device in which the approaches of above can be implemented.

9. Device

Figure 8:
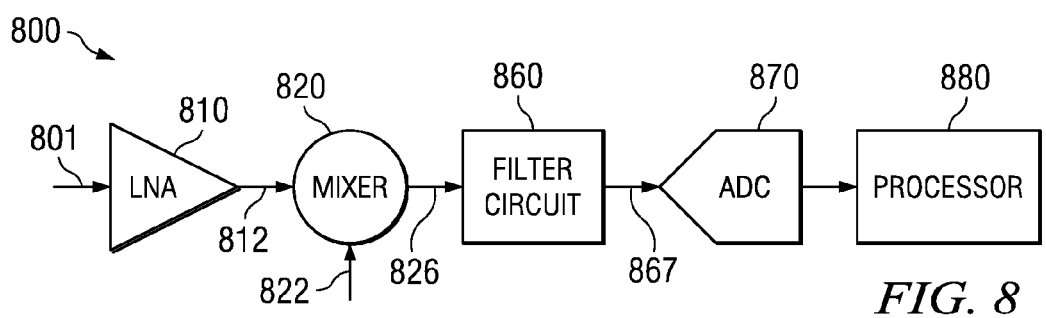
FIG. 8 is a block diagram of a receiver system illustrating an example system in which various aspects of the present invention may be implemented In the drawings, like reference numbers generally indicate identical, functionally similar, and/or structurally similar elements. The drawing in which an element first appears is indicated by the leftmost digit (s) in the corresponding reference number.

FIG. 8 is a block diagram of receiver system 800 illustrating an example system in which various aspects of the present invention may be implemented. For illustration, it is assumed that receiver system 800 is implemented within a Wireless Receiver. However, receiver system 800 can be implemented in other devices (wireless as well as wire_based communications) as well.

Receiver system 800 is shown containing low noise amplifiers (LNA) 810, mixer 820, filter circuit 860, analog to digital converter (ADC) 870, and processor 880. Each block/stage is described in further detail below.

LNA 810 receives signals on path 801 and amplifies the received signals to generate a corresponding amplified signal on path 812. For example, in wireless systems, the signals that are transmitted from satellites, etc. may be received by an antenna (not shown) and the received signals are provided on path 801. The received signals may be weak in strength and thus amplified by LNA 810 for further processing. LNA 810 may be implemented in a known way.

Mixer 820 may be used to down_convert the received amplified signal on path 812 into an intermediate signal with the frequency band of interest centered at a lower frequency than the carrier frequency of the received signal. In an embodiment, a signal with the frequency band of interest centered at 2.4 GHZ (carrier frequency) is converted to a signal with the frequency band of interest centered at zero frequency.

Mixer 820 may receive the amplified signal on path 812 and a signal of fixed frequency on path 822 as inputs, and provides the intermediate signal on path 826. The signal of fixed frequency on path 822 may be generated by a phase locked loop (not shown) in a known way.

Filter circuit 860 may correspond to a low pass filter, which allows the desired low frequencies and rejects all other unwanted high frequencies present in the signal received on line 826. The filtered signal, which contains the frequency band of interest, is provided on path 867.

ADC 870 converts (samples) the filtered signal received on path 867 to a corresponding digital value, which represents the signal of interest in received signal 801. Processor 880 processes the received digital values to provide various user applications and may be implemented as multiple processing units, each potentially operating independently. ADC 870 may correspond to the ADCs described in sections above (and implemented according to various aspects of the present invention).

10. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. An analog to digital converter (ADC) containing a plurality of stages including a first stage and a second stage connected in sequence, said ADC being required to support operation at a desired frequency for a desired error tolerance, said first stage and second stage together comprising:
a pre-amplifier and a main amplifier;
a plurality of impedances and a plurality of switches operating to amplify an input signal provided to said first stage using both of said pre-amplifier and said main amplifier connected in series in a one phase, and operating to amplify an output of said first stage using only said main amplifier in said second stage in an another phase,
said plurality of impedances providing an amplification characteristic of each of said one phase and said another phase, said amplification characteristic having a first pole and a second pole in said one phase, and only a single pole in said another phase, wherein said amplification characteristic is represented in gain versus frequency response,
wherein said first pole of said one phase and said single pole of said another phase are at least at the same frequency for the same loads offered in said one phase and said another phase.

2. The ADC of claim 1, wherein said second pole of said one phase is located such that the unity gain bandwidth (UGB) of said amplification characteristic in said one phase is not less than said desired frequency.

3. The ADC of claim 2, wherein said second pole is located at a frequency greater than said desired frequency.

4. The ADC of claim 3, wherein said amplification characteristic is represented by a Bode plot and a gain roll off equaling 40 Db/decade starts after said desired frequency, wherein decade represents 10 units of frequency in logarithmic scale on said Bode plot.

5. The ADC of claim 2, wherein said plurality of impedances comprise a plurality of capacitors.

6. The ADC of claim 2, wherein said plurality of impedances and said plurality of switches comprise:
a first sampling capacitor (710);
a first switch (711) connecting an input signal to one terminal of said first sampling capacitor in said another phase and being open in said one phase such that the said first sampling capacitor samples said input signal in said another phase, another terminal of said first sampling capacitor being connected to a common bias in said another phase;
a second switch (721) connecting said first sampling capacitor to a reference voltage in said one phase, and being open in said another phase;
a first feedback capacitor (720);
a third switch (722) connecting said first feedback capacitor between an input of said pre-amplifier and an output of said main amplifier in said one phase and being open in said another phase;
a fourth switch (723) connecting the output of said pre-amplifier to the input of said main amplifier in said one phase and being open in said another phase;
a second sampling capacitor (760);
a fifth switch (725) connecting said second sampling capacitor to the output of said main amplifier in said one phase, said fifth switch being open in said another phase;
a sixth switch (724) connecting said second sampling capacitor to a constant bias in said one phase, and being open in said another phase;
a second feedback capacitor (770);
a seventh switch (715) connecting said second feedback capacitor across said main amplifier in said another phase, and being open in said one phase;
an eighth switch (714) connecting said second sampling capacitor to said reference voltage in said another phase, and being open in said one phase; and
a ninth switch (713) connecting said second sampling capacitor and said second feedback capacitor to said input of said main amplifier in said one phase, and disconnecting said second sampling capacitor and said second feedback capacitor from said input of said main amplifier in said another phase.

7. The ADC of claim 6, wherein said one phase comprises a hold phase and said another phase comprises a sampling phase of said first stage.

8. The ADC of claim 6, wherein a open loop gain($G_{pre-amp}$) of said pre-amplifier is selected according to:

$$G_{pre-amp} = P/1 - K/N + 3$$

wherein P represents the capacitor scaling factor, K represents the number of bits resolved by said second stage and N represents the number of bits to be resolved by the following stages.

9. The ADC of claim 8, wherein gain bandwidth at a closed loop gain of 3 Db $\omega CL3B1$ of main amplifier is given by:

$$\omega_{CL3B1} = T/N - K + *Ln(2)$$

wherein T represents the desired settling time of said ADC in said one phase.

10. An analog to digital converter (ADC) containing a plurality of stages including a first stage and a second stage connected in sequence, said ADC being required to support operation at a desired frequency for a desired error tolerance, said first stage and second stage together comprising:

a pre-amplifier (780), a main amplifier, a first sampling capacitor (710), a second sampling capacitor (760), a first feedback capacitor (720), and a second feedback capacitor (770), wherein said pre-amplifier and said main amplifier together provide amplification needed for said first stage using said first sampling capacitor and said first feedback capacitor in a one phase, wherein said pre-amplifier and said main amplifier are connected in series, and said first feedback capacitor is connected across said pre-amplifier and said main amplifier connected in series, wherein said main amplifier provides amplification needed for said second stage using said second sampling capacitor and said second feedback capacitor in an another phase, said second feedback capacitor being connected across said main amplifier in said another phase, said first sampling capacitor sampling a next sample in said another phase, wherein said second sampling capacitor and said second feedback capacitor are not connected across said main amplifier in said one phase, and further comprising:

a first sampling capacitor (710);

a first switch (711) connecting an input signal to one terminal of said first sampling capacitor in said another phase and being open in said one phase such that the said first sampling capacitor samples said input signal in said another phase, another terminal of said first sampling capacitor being connected to a common bias in said another phase;

a second switch (721) connecting said first sampling capacitor to a reference voltage in said one phase, and being open in said another phase;

a first feedback capacitor (720);

a third switch (722) connecting said first feedback capacitor between an input of said pre-amplifier and an output of said main amplifier in said one phase and being open in said another phase;

a fourth switch (723) connecting the output of said pre-amplifier to the input of said main amplifier in said one phase and being open in said another phase;

a second sampling capacitor (760);

a fifth switch (725) connecting said second sampling capacitor to the output of said main amplifier in said one phase, said fifth switch being open in said another phase;

a sixth switch (724) connecting said second sampling capacitor to a constant bias in said one phase, and being open in said another phase;

a second feedback capacitor (770);

a seventh switch (715) connecting said second feedback capacitor across said main amplifier in said another phase, and being open in said one phase;

an eighth switch (714) connecting said second sampling capacitor to said reference voltage in said another phase, and being open in said one phase; and a ninth switch (713) connecting said second sampling capacitor and said second feedback capacitor to said input of said main amplifier in said one phase, and disconnecting said second sampling capacitor and said second feedback capacitor from said input of said main amplifier in said another phase.

* * * * *